US 9,754,808 B2

(12) United States Patent
Wei et al.

(10) Patent No.: US 9,754,808 B2
(45) Date of Patent: Sep. 5, 2017

(54) APPARATUS FOR FLIPPING SEMICONDUCTOR DEVICE FOR TRANSFERRING THE SEMICONDUCTOR DEVICE BETWEEN SUBSTRATES

(71) Applicant: EPISTAR CORPORATION, Hsinchu (TW)

(72) Inventors: Chih-Wei Wei, Hsinchu (TW); Chia-Liang Hsu, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 14/960,819

(22) Filed: Dec. 7, 2015

(65) Prior Publication Data
US 2016/0086836 A1 Mar. 24, 2016

Related U.S. Application Data

(63) Continuation of application No. 14/150,439, filed on Jan. 8, 2014, now Pat. No. 9,209,058.

(51) Int. Cl.
H01L 21/50 (2006.01)
H01L 21/68 (2006.01)
B21D 37/14 (2006.01)
H01L 21/67 (2006.01)

(52) U.S. Cl.
CPC .............. *H01L 21/68* (2013.01); *B21D 37/14* (2013.01); *H01L 21/67109* (2013.01)

(58) Field of Classification Search
CPC ............... H01L 21/68; H01L 21/67109; H01L 2221/68363; H01L 2224/03003; H01L 2224/27003; B21D 37/14; Y10T 29/49799; Y10T 29/19126
USPC ........................................ 156/230, 231, 232
See application file for complete search history.

(56) References Cited

U.S. PATENT DOCUMENTS

| 3,554,125 | A | 1/1971 | Van Dorn et al. |
| 5,007,626 | A | 4/1991 | Blaimschein |
| 5,240,546 | A | 8/1993 | Shiga |
| 5,343,363 | A | 8/1994 | Greeson et al. |
| 5,458,715 | A * | 10/1995 | Takeuchi ............... B41M 5/025 156/229 |
| 5,705,016 | A | 1/1998 | Senoo et al. |
| 6,235,144 | B1 | 5/2001 | Yamamoto et al. |
| 6,488,803 | B2 * | 12/2002 | Kiuchi ................... C09J 7/0246 156/230 |

(Continued)

FOREIGN PATENT DOCUMENTS

TW 565003 U 12/2003
TW I239796 B 9/2005

*Primary Examiner* — Jun Yoo
(74) *Attorney, Agent, or Firm* — Ditthavong & Steiner, P.C.

(57) ABSTRACT

A method for automatically transferring multiple semiconductor devices from a first substrate to a second substrate comprises steps of providing a first substrate on which the semiconductor device is formed, providing a second substrate directly under the first substrate, automatically moving the first substrate toward the second substrate such that the semiconductor devices are close to the second substrate; connecting the semiconductor devices to the second substrate by exerting force to the second substrate, and taking out the semiconductor devices simultaneously from the first substrate.

10 Claims, 3 Drawing Sheets

(56) References Cited

U.S. PATENT DOCUMENTS

| | | | | |
|---|---|---|---|---|
| 6,664,169 | B1* | 12/2003 | Iwasaki | C25D 11/32 |
| | | | | 257/E21.216 |
| 6,818,104 | B2* | 11/2004 | Iwasaki | C25D 11/32 |
| | | | | 204/193 |
| 6,889,427 | B2 | 5/2005 | Yee et al. | |
| 7,078,262 | B2* | 7/2006 | Yamamoto | H01L 21/67132 |
| | | | | 257/E21.122 |
| 7,420,263 | B2* | 9/2008 | Park | H01L 21/78 |
| | | | | 156/250 |
| 7,875,530 | B2* | 1/2011 | Tamura | H01L 27/1266 |
| | | | | 438/113 |
| 7,923,629 | B2* | 4/2011 | Park | H01G 9/2027 |
| | | | | 136/263 |
| 8,038,824 | B2 | 10/2011 | Kobayashi et al. | |
| 8,137,050 | B2 | 3/2012 | Yamada et al. | |
| 9,161,448 | B2* | 10/2015 | Menard | |
| 9,209,058 | B2* | 12/2015 | Wei | H01L 21/68 |
| 2004/0055894 | A1* | 3/2004 | Iwasaki | C25D 11/32 |
| | | | | 205/157 |
| 2007/0062644 | A1 | 3/2007 | Nakamura et al. | |
| 2007/0125421 | A1* | 6/2007 | Park | H01G 9/2027 |
| | | | | 136/263 |
| 2007/0128747 | A1* | 6/2007 | Tamura | H01L 27/1214 |
| | | | | 438/22 |
| 2008/0142939 | A1 | 6/2008 | Yang et al. | |
| 2008/0236743 | A1 | 10/2008 | Kye et al. | |
| 2009/0314430 | A1 | 12/2009 | Nakamura | |
| 2012/0115262 | A1* | 5/2012 | Menard | H01L 21/6835 |
| | | | | 438/26 |
| 2013/0273695 | A1* | 10/2013 | Menard | H01L 21/6835 |
| | | | | 438/118 |
| 2016/0086836 | A1* | 3/2016 | Wei | H01L 21/68 |
| | | | | 29/832 |
| 2016/0190091 | A1* | 6/2016 | Menard | H01L 21/6835 |
| | | | | 438/121 |

* cited by examiner

APPARATUS FOR FLIPPING SEMICONDUCTOR DEVICE FOR TRANSFERRING THE SEMICONDUCTOR DEVICE BETWEEN SUBSTRATES

REFERENCE TO RELATED APPLICATION

This application is a continuation application of U.S. patent application Ser. No. 14/150,439, now U.S. Pat. No. 9,209,058, the content of which is hereby incorporated by reference in its entirety.

TECHNICAL FIELD

The present application relates to a method for flipping multiple semiconductor devices in wafer form or in chip form.

DESCRIPTION OF BACKGROUND ART

In order to fit in the process of producing a semiconductor device or adjust by the limitation of the apparatus, the semiconductor device needs to be flipped so as to reverse the top surface and the bottom surface of the semiconductor device.

Presently the flipping step is carried out manually. As a result, the flipping step requires human effort and is time-consuming, and furthermore, the semiconductor device during the flipping step is prone to damage.

SUMMARY OF THE DISCLOSURE

A method for automatically transferring multiple semiconductor devices from a first substrate to a second substrate comprises steps of providing a first substrate on which the semiconductor device is formed, providing a second substrate directly under the first substrate, automatically moving the first substrate toward the second substrate such that the semiconductor devices are close to the second substrate; connecting the semiconductor devices to the second substrate by exerting force to the second substrate, and taking out the semiconductor devices simultaneously from the first substrate.

DETAILED DESCRIPTION OF PREFERRED EMBODIMENTS

Figure 1:
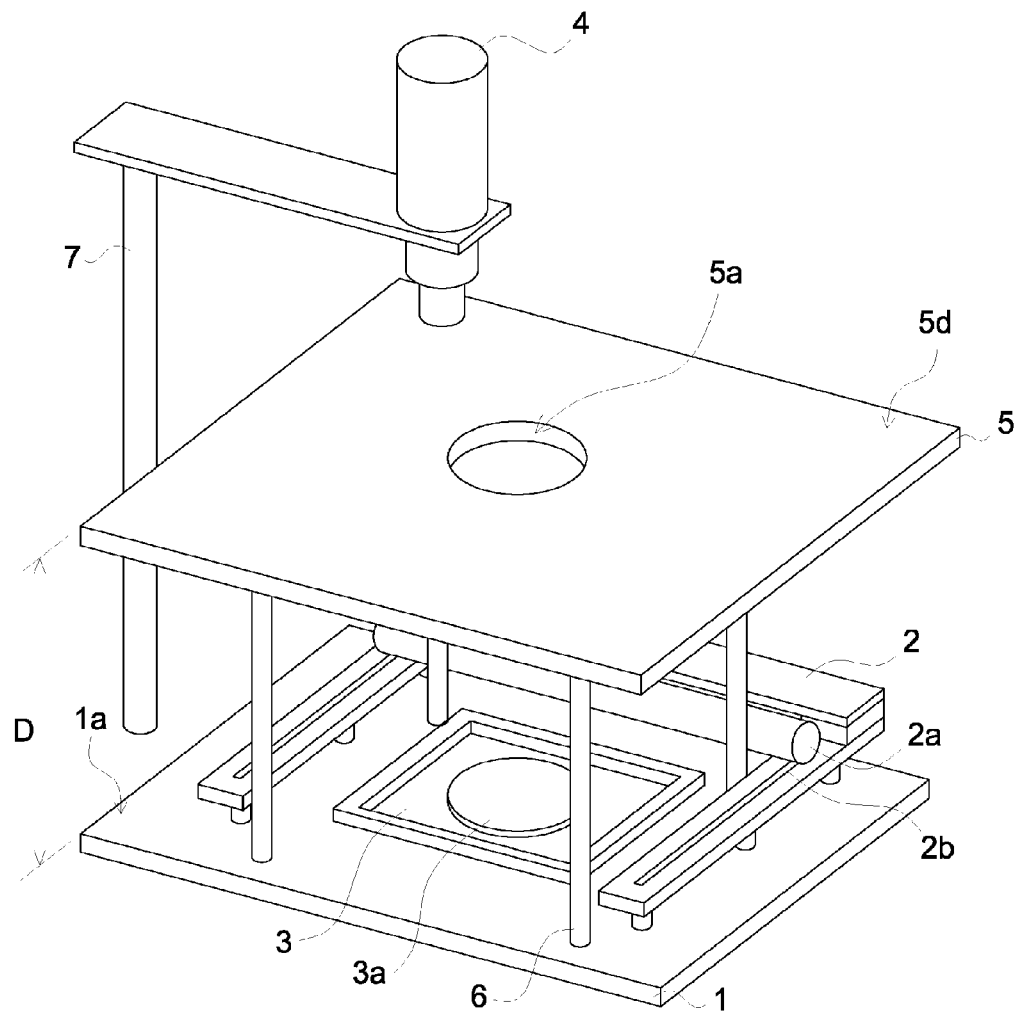
FIG. 1 is a diagram of the apparatus for flipping a semiconductor device in accordance with the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

FIG. 1 is a diagram of the apparatus for flipping a semiconductor device in accordance with an embodiment of the present application. The apparatus for flipping a semiconductor device comprises: a platform 1 comprising an upper surface 1a, a roller system 2 and a carrier 3 on the upper surface 1a; a positioning unit 5 comprising an upper surface 5d above the platform 1 and comprising a circular opening 5a; and an elevating unit 6 connecting the platform 1 and the positioning unit 5.

In the present embodiment, the roller system 2 comprises a roller 2a and a track 2b, wherein the roller 2a moves along the track 2b. The roller 2a comprises non rigid body or elastic material, such as rubber. More preferably, the roller 2a is composed of rubber. The roller 2a can roll and exert a downward pressure on an object. The roller 2a can roll with a constant speed, variable speed, or a constant acceleration. Besides, the shape of the roller 2a can be a cylinder or a barrel-shaped cylinder with two extending cylinder ends. Specifically, the barrel-shaped cylinder is defined as a cylinder having a lager thickness in the middle portion than the other portion. The carrier 3 comprises a heating unit (not shown). The apparatus for flipping a semiconductor device further comprises a fixture 3a on the carrier 3. Besides, an adhesive substance (not shown) is adhered to the fixture 3a, wherein the stickiness of the adhesive substance changes with the change of temperature. In the present embodiment, the adhesive substance can be a foam sealing agent.

The positioning unit 5 is above the platform 1 and comprises the circular opening 5a. Furthermore, a movable heater 4 is fixed on a pillar 7. The pillar 7 can move along the vertical direction so as to change the position of the movable heater 4 above the positioning unit 5. The elevating unit 6 is between the platform 1 and the positioning unit 5 and connects the platform 1 and the positioning unit 5. The elevating unit 6 further comprises a pneumatic cylinder (not shown) for providing driving force. In the present embodiment, the elevating unit 6 comprises 4 adjustable uniaxial cylinders. The elevating unit 6 moves along the vertical direction so as to move the positioning unit 5 toward or away from the platform 1.

The apparatus for flipping a semiconductor device in accordance with the present application is capable of flipping a semiconductor device so as to reverse a top surface and a bottom surface of the semiconductor device, wherein the semiconductor device is in wafer form or in chip form, such as light-emitting diode wafer or light-emitting diode chip. In the present embodiment, the semiconductor device comprises multiple light-emitting diode chips 8. The steps of the operation method of the apparatus for flipping a semiconductor device are described as follows.

Figure 2A:
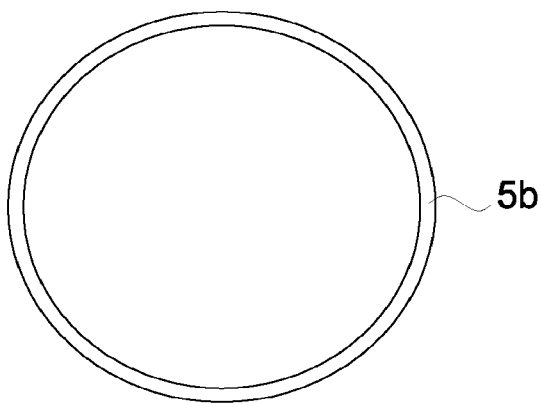
FIGS. 2a to 2c schematically show a semiconductor device fixed on an adhesive substance in accordance with an embodiment of the present application.
Figure 2B:
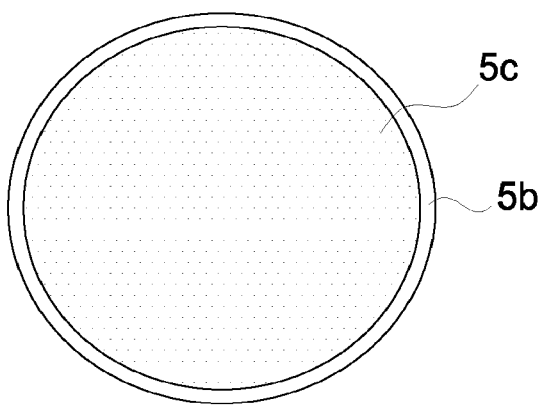
Figure 2C:
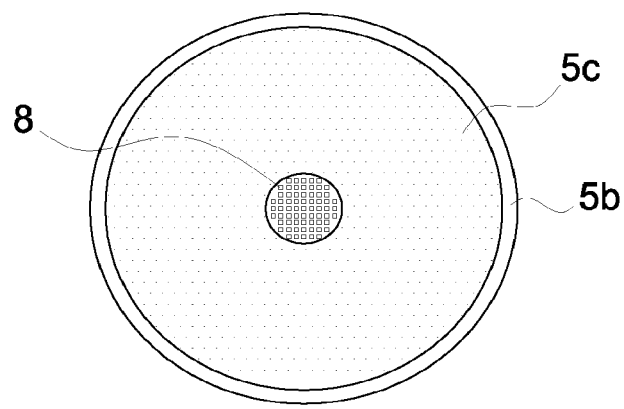

1. The light-emitting diode chips 8 are fixed on an adhesive substance 5c attached to an iron ring 5b as shown in FIGS. 2a to 2c. Specifically, referring to FIG. 2a, an iron ring 5b is provided. Referring to FIG. 2b, an adhesive substance 5c is applied to associate with the iron ring 5b. In the present embodiment, the adhesive substance 5c can be an adhesive film. Referring to FIG. 2C, the light-emitting diode chips 8 are fixed to the iron ring 5b by directly connecting each bottom surface of the light-emitting diode chips 8 to the adhesive substance 5c, wherein each top surface of the light-emitting diode chips 8 faces upwardly. In the present embodiment, the stickiness of the adhesive substance 5c changes with the change of the temperature, and the change of the stickiness does not contaminate and affect the light-emitting diode chips 8.

2. The iron ring 5b is fixed to the positioning unit 5. Specifically, the iron ring 5b attached to the adhesive substance 5c is fixed at the circular opening 5a and each top surface of the light-emitting diode chips 8 faces downwardly while the positioning unit 5 is at a position where a distance between the upper surface 5d of the positioning unit 5 and the upper surface 1a of the platform 1 is D, wherein the position is defined as starting position.

Figure 3:
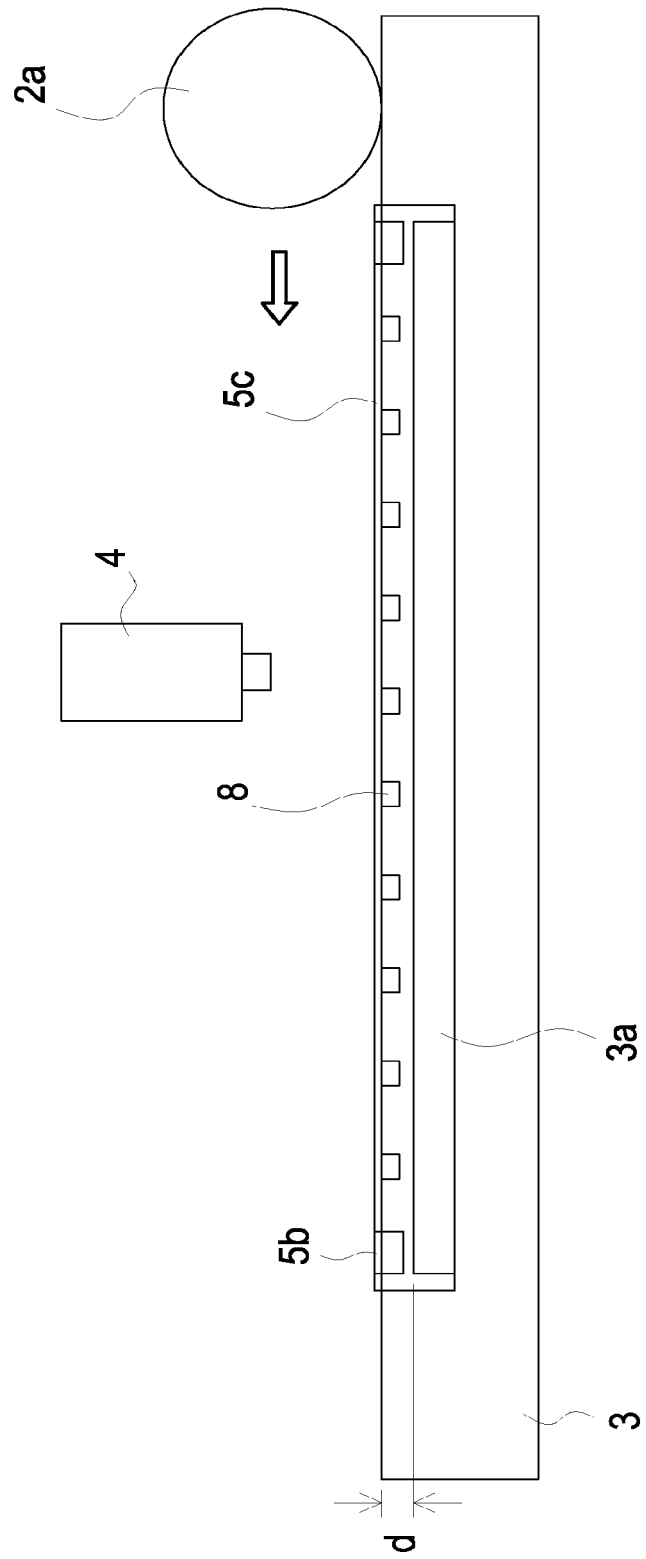
FIG. 3 schematically shows a step of flipping the semiconductor device in accordance with an embodiment of the present application.

3. The positioning unit 5 is set to a predetermined position. Specifically, referring to FIG. 3, a substrate (not shown) is disposed on the fixture 3a, wherein the substrate comprises $Al_2O_3$. Besides, an adhesive substance (not shown) such as a foam sealing agent is adhered to the substrate. The heating unit of the carrier 3 is then turned on to heat the adhesive substance so as to enhance the stickiness of the adhesive substance. The relative position and the distance between the circular opening 5a and the fixture 3a of the carrier 3 are adjusted by moving the elevating unit 6 so as to facilitate the following flipping step. In the present embodiment, the distance d between the iron ring 5b and the fixture 3a is not more than 0.2 cm.

4. The light-emitting diode chips 8 are flipped. Specifically, referring to FIG. 3, after the positioning unit 5 being completely set to the predetermined position, the roller 2a rolls and exerts a downward pressure while moving along the track 2d as shown in FIG. 1. In the present embodiment, the roller 2a rolls on the surface of the adhesive substance 5c attached to the iron ring 5b back and forth at least one time. In general, the movement of the rolling and exerting a downward pressure of the roller 2a can be carried out by a programmable logic controller (PLC) (not shown). The pillar 7 then moves downwardly to change the position and the distance of the movable heater 4 above the adhesive substance 5c attached to the iron ring 5b. The movable heater 4 is then turned on to heat the adhesive substance 5c so as to change the stickiness of the adhesive substance 5c with the change of the temperature. As a result, the light-emitting diode chips 8 that were originally adhered to the adhesive substance 5c are now transferred to the adhesive substance of the substrate of the fixture 3a. Finally, the top surface and the bottom surface of each light-emitting diode chip are reversed.

5. The positioning unit returns to the starting position.

6. The light-emitting diode chips 8 are taken out from the adhesive substance of the substrate of the fixture 3a.

7. In the present embodiment in accordance with the present application, the semiconductor device comprises multiple light-emitting diode chips 8, wherein each light-emitting diode chip 8 comprises AlGaInP-based material, AlGaInN-based material or ZnO-based material.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A method for transferring a plurality of semiconductor devices from a first substrate to a second substrate, the method comprising steps of:
    providing the first substrate on which the plurality of semiconductor devices are fixed, wherein the first substrate is an adhesive film applied to a ring and the plurality of semiconductor devices are provided within the ring by directly connecting their bottom surfaces to the adhesive film;
    providing a positioning unit having a circular opening;
    fixing the ring in the circular opening of the positioning unit such that top surfaces of the plurality of semiconductor devices face downwardly;
    providing the second substrate directly under the first substrate;
    moving the first substrate toward the second substrate by setting the positioning unit to a predetermined position such that the plurality of semiconductor devices are close to the second substrate;
    moving a movable heater above the adhesive film and turning on the movable heater to heat the adhesive film;
    connecting the top surfaces of the plurality of semiconductor devices to the second substrate by exerting force on the first substrate, wherein exerting force on the first substrate is carried out by a first device in accordance with an instruction from a programmable controller; and
    after the connecting step, taking out the plurality of semiconductor devices simultaneously from the first substrate.

2. The method according to claim 1, further comprising a step of providing a fixture and fixing the second substrate on the fixture.

3. The method according to claim 2, wherein a distance between the fixture and the first substrate is less than or equal to 0.2 cm before the connecting step.

4. The method according to claim 1, further comprising a step of heating the second substrate before the step of connecting step.

5. The method according to claim 1, further comprising a step of decreasing a stickiness between the semiconductor devices and a first surface of the first substrate.

6. The method according to claim 5, further comprising a step of thermal treating the first substrate for decreasing the stickiness between the semiconductor devices and the first surface.

7. The method according to claim 1, further comprising a step of providing the positioning unit for moving the first substrate from a the starting position to the predetermined position for making the semiconductor devices close to the second substrate.

8. The method according to claim 7, further comprising a step of fixing the first substrate on the positioning unit by the ring in the step of providing the positioning unit for moving the first substrate.

9. The method according to claim 8, wherein the step of fixing the first substrate on the positioning unit further comprises attaching the first substrate to the ring and fixing the ring on the positioning unit.

10. The method according to claim 1, wherein the first device comprises a roller.

* * * * *